US012622295B2

(12) United States Patent
Chen et al.

(10) Patent No.: US 12,622,295 B2
(45) Date of Patent: May 5, 2026

(54) SIGNAL-HEAT SEPARATED TMV PACKAGING STRUCTURE AND MANUFACTURING METHOD THEREOF

(71) Applicant: Zhuhai ACCESS Semiconductor Co., Ltd., Guangdong (CN)

(72) Inventors: Xianming Chen, Guangdong (CN); Lei Feng, Guangdong (CN); Benxia Huang, Guangdong (CN); Yejie Hong, Guangdong (CN); Gao Huang, Guangdong (CN)

(73) Assignee: Zhuhai ACCESS Semiconductor Co., Ltd., Guangdong (CN)

( * ) Notice: Subject to any disclaimer, the term of this patent is extended or adjusted under 35 U.S.C. 154(b) by 783 days.

(21) Appl. No.: 17/821,725

(22) Filed: Aug. 23, 2022

(65) Prior Publication Data

US 2023/0127494 A1 Apr. 27, 2023

(30) Foreign Application Priority Data

Oct. 27, 2021 (CN) .......................... 202111258931.8

(51) Int. Cl.
H01L 23/498 (2006.01)
H01L 21/48 (2006.01)
(Continued)

(52) U.S. Cl.
CPC .... H01L 23/49838 (2013.01); H01L 21/4853 (2013.01); H01L 21/4857 (2013.01);
(Continued)

(58) Field of Classification Search
CPC .............. H01L 23/49838; H01L 23/13; H01L 23/3121; H01L 23/3736; H01L 23/49811;
(Continued)

(56) References Cited

U.S. PATENT DOCUMENTS

2014/0048906 A1* 2/2014 Shim ...................... H01L 21/561
257/532
2015/0001708 A1* 1/2015 Lin .......................... H01L 25/50
257/737
(Continued)

FOREIGN PATENT DOCUMENTS

JP 2021528845 A 10/2021
KR 20120078781 A 7/2012
(Continued)

OTHER PUBLICATIONS

Office Action of Japanese Patent Application No. 2022-125067 mailed Sep. 28, 2023, 8 pages with translations.
(Continued)

*Primary Examiner* — Marlon T Fletcher
*Assistant Examiner* — Christina A Sylvia
(74) *Attorney, Agent, or Firm* — Buchalter; Jason Croft

(57) ABSTRACT

A signal-heat separated TMV packaging structure includes an insulating dielectric material, an inner signal line layer arranged in the insulating dielectric material, an outer signal line layer, a heat dissipation metal face and a chip. A first side of the insulating dielectric material is provided with an isolating layer. The outer signal line layer is arranged on a surface of a second side of the insulating dielectric material and is connected with the inner signal line layer through a TMV structure. The heat dissipation metal face is arranged on a surface of the first side of the insulating dielectric material, and is separated from the inner signal line layer. The chip is embedded in the insulating dielectric material, with an active face in electrically-conductive connection with the inner signal line layer and a passive face in heat transfer connection with the heat dissipation metal face.

6 Claims, 11 Drawing Sheets

(51) Int. Cl.

| | |
|---|---|
| *H01L 21/56* | (2006.01) |
| *H01L 23/00* | (2006.01) |
| *H01L 23/13* | (2006.01) |
| *H01L 23/31* | (2006.01) |
| *H01L 23/373* | (2006.01) |

(52) U.S. Cl.
CPC ........ *H01L 21/486* (2013.01); *H01L 21/4882* (2013.01); *H01L 21/565* (2013.01); *H01L 23/13* (2013.01); *H01L 23/3121* (2013.01); *H01L 23/3736* (2013.01); *H01L 23/49811* (2013.01); *H01L 23/49822* (2013.01); *H01L 24/48* (2013.01); *H01L 2224/48229* (2013.01); *H01L 2924/1815* (2013.01); *H01L 2924/182* (2013.01); *H01L 2924/183* (2013.01)

(58) Field of Classification Search
CPC .......... H01L 23/49822; H01L 23/3677; H01L 23/367; H01L 23/481; H01L 23/14; H01L 23/3737; H01L 23/40; H01L 23/488; H01L 21/4853; H01L 21/4857; H01L 21/486; H01L 21/4882; H01L 21/565; H01L 21/568; H01L 21/6835; H01L 21/4821; H01L 21/4885; H01L 21/4892; H01L 24/48; H01L 24/85; H01L 24/20; H01L 24/25; H01L 24/03; H01L 2224/48229; H01L 2224/0231; H01L 2224/02331; H01L 2224/02381; H01L 2924/1815; H01L 2924/182; H01L 2924/183; H01L 2221/68345; H01L 2221/68359; H01L 2221/68368
See application file for complete search history.

(56) References Cited

U.S. PATENT DOCUMENTS

| | | | |
|---|---|---|---|
| 2017/0084596 A1 | 3/2017 | Scanlan | |
| 2022/0068760 A1* | 3/2022 | Chen ...................... H01L 24/19 |

FOREIGN PATENT DOCUMENTS

| | | |
|---|---|---|
| KR | 20210094329 A | 7/2021 |
| TW | 200614441 A | 5/2006 |
| TW | 200913862 A | 3/2009 |

OTHER PUBLICATIONS

Office Action of Korean Patent Application No. 10-2022-0098833 mailed Jan. 15, 2024, 9 pages with translations.
First Office Action of Taiwanese Patent Application No. 111126708 mailed Aug. 28, 2023, 21 pages with translations.
Second Office Action of Taiwanese Patent Application No. 111126708 mailed Nov. 22, 2023, 23 pages with translations.
Third Office Action of Taiwanese Patent Application No. 111126708 mailed Feb. 22, 2024, 9 pages with translations.

* cited by examiner

SIGNAL-HEAT SEPARATED TMV PACKAGING STRUCTURE AND MANUFACTURING METHOD THEREOF

CROSS-REFERENCE TO RELATED APPLICATION

This application is based on and claims the benefit of priority from Chinese Patent Application No. 2021112589318, filed on 27 Oct. 2021, the entirety of which is incorporated by reference herein.

TECHNICAL FIELD

The disclosure relates to the technical field of semiconductor packaging, and more particularly, to a signal-heat separated TMV packaging structure and a manufacturing method thereof.

BACKGROUND

With the development and progress of electronic technologies, electronic products are becoming shorter and thinner, which promotes the development of packaging structures of the electronic products towards high integration and miniaturization. Meanwhile, the electronic products are required to have more and more powerful functions, and computational loads of chips packaged by packaging bodies are increasingly larger. As a result, a heat flux density per unit area of the packaging body increases rapidly. If the generated heat cannot be dissipated quickly, running speeds and performances of the electronic components will decrease due to the continuous temperature rise, and the reliability of the electronic products will also be greatly affected. Therefore, how to realize higher density integrated packaging and how to solve the heat dissipation problem of the packaging body are very important issues in the current packaging field.

In the existing technology of packaging, a conventional wire-bonding packaging method is to pre-fix components such as chips on a surface of a substrate, and then realize electrical connection between the components and the substrate by means of wire bonding, and finally package with a packaging material (molding). However, this method has at least the following disadvantages:

(1) Mounting the chip on the substrate surface and then wire bonding may increase the package volume, which cannot meet the development requirements of high-density integration and miniaturization; and (2) after the chip is packaged, one side of the chip is the packaging material, and the other side is welded with a PCB through a bonding pad, which leads to poor heat dissipation effect of the chip. Even if a heat dissipation copper surface is arranged on the back of the chip, the space of the heat dissipation copper surface is limited by the packaging structure, which cannot really address the heat dissipation problem in the operating process of the chip.

SUMMARY

The disclosure aims at solving at least one of the technical problems in the existing technology. Therefore, the disclosure provides a signal-heat separated TMV (Through Molding Via) packaging structure and a manufacturing method thereof, which can realize high-density integration and signal-heat separation, and greatly improve the heat dissipation effect.

In a first aspect, a signal-heat separated TMV packaging structure according to an embodiment of the disclosure includes an insulating dielectric material having a first side and a second side which are opposite to each other, where the first side of the insulating dielectric material is provided with an isolating layer; an inner signal line layer arranged in the insulating dielectric material; an outer signal line layer arranged on a surface of the second side of the insulating dielectric material and connected with the inner signal line layer through a TMV structure; a heat dissipation metal face arranged on a surface of the first side of the insulating dielectric material, where the heat dissipation metal face and the inner signal line layer are separated through the isolating layer; and a chip provided with an active face and a passive face which are opposite to each other, where the chip is embedded in the insulating dielectric material, the active face of the chip is in electrically-conductive connection with the inner signal line layer, and the passive face of the chip is in heat transfer connection with the heat dissipation metal face.

The signal-heat separated TMV packaging structure according to the embodiment of the disclosure at least has the following beneficial effects.

The chip is embedded in the insulating dielectric material, which is beneficial to realize higher-density integrated packaging. The heat dissipation metal face and the inner signal line layer are separated by the isolating layer, which can realize signal and heat separation, and greatly improve the heat dissipation effect.

According to some embodiments of the disclosure, the passive face of the chip is directly connected with the heat dissipation metal face, or a thermally-conductive metal is connected between the passive surface of the chip and the heat dissipation metal face.

According to some embodiments of the disclosure, the thermally-conductive metal includes a thermally-conductive metal face and a thermally-conductive metal column, a first side of the thermally-conductive metal face is connected with the passive face of the chip, and a second side of the thermally-conductive metal face is connected with the heat dissipation metal face through the thermally-conductive metal column.

According to some embodiments of the disclosure, the inner signal line layer is provided with multiple layers, and adjacent inner signal line layers are connected by a second conductive metal column.

According to some embodiments of the disclosure, the TMV structure is a first conductive metal column, and the first conductive metal column is directly connected with the inner signal line layer, or a tin solder is connected between the first conductive metal column and the inner signal line layer.

According to some embodiments of the disclosure, the insulating dielectric material includes a plurality of insulating layers laminated in sequence, and one of the insulating layers located on the first side of the insulating dielectric material serves as the isolating layer.

According to some embodiments of the disclosure, the insulating dielectric material further includes a packaging layer, the plurality of insulating layers define a packaging cavity for accommodating the chip, and the packaging layer covers an adjacent insulating layer, fills the packaging cavity, and wraps around the chip.

In a second aspect, a manufacturing method of a signal-heat separated TMV packaging structure according to an embodiment of the disclosure includes:

providing a substrate with a first side and a second side which are opposite to each other, and machining a temporary bearing surface on a surface of the second side of the substrate, where the substrate is provided with a packaging cavity, a first inner signal line layer and a first metal column, the packaging cavity extends across the first side and the second side of the substrate which are opposite to each other, the first inner signal line layer is partially or completely arranged on a surface of the first side of the substrate, a first end of the first metal column is in electrically-conductive connection with the first inner signal line layer, a second end of the first metal column is exposed to the surface of the second side of the substrate, and the temporary bearing surface covers the packaging cavity;

mounting a chip to be packaged in the packaging cavity and wire-bonding the chip with the first inner signal line layer, where an active face of the chip faces the first side of the substrate, and a passive surface of the chip is connected with the temporary bearing surface;

machining a first conductive metal column on the first side of the substrate, and packaging the first conductive metal column by a second insulating dielectric material to form a packaging layer, where the first conductive metal column is connected with the first inner signal line layer;

removing the temporary bearing surface, and machining a second inner signal line layer on the surface of the second side of the substrate, where the second inner signal line layer includes a second inner signal line and a thermally-conductive metal face, the second inner signal line is connected with the first metal column, and the thermally-conductive metal face is connected with the passive face of the chip;

machining a thermally-conductive metal column on the thermally-conductive metal face, and forming an isolating layer by laminating; and machining an outer signal line layer on a surface of the packaging layer and machining a heat dissipation metal face on a surface of the isolating layer, where the outer signal line layer is connected with the first conductive metal column, and the heat dissipation metal face is connected with the thermally-conductive metal column The manufacturing method of a signal-heat separated TMV packaging structure according to the embodiment of the disclosure at least has the following beneficial effects.

The chip is mounted in the packaging cavity, which is beneficial to realize higher-density integrated packaging. The heat dissipation metal face and the second inner signal line layer are separated by the isolating layer, which can realize signal and heat separation, and greatly improve the heat dissipation effect.

According to some embodiments of the disclosure, the first inner signal line layer includes a plurality of line layers, where one of the line layers is arranged on a surface of the first side of the substrate, the other line layers are embedded in the substrate, and the plurality of line layers are connected by metal columns;

or, the first inner signal line layer includes a single line layer, and the single line layer is arranged on the surface of the first side of the substrate.

According to some embodiments of the disclosure, the machining a first conductive metal column on the first side of the substrate includes:

mounting the first conductive metal column on the first side of the substrate at a position corresponding to the first inner signal line layer; and welding the first conductive metal column with the first inner signal line layer through a tin solder.

According to some embodiments of the disclosure, the machining a first conductive metal column on the first side of the substrate includes:

machining a photosensitive mask on the first side of the substrate, where the photosensitive mask is provided with a window adapted to the first conductive metal column;

electroplating the substrate to form the first conductive metal column in the window; and removing the photosensitive mask.

In a third aspect, a manufacturing method of a signal-heat separated TMV packaging structure according to an embodiment of the disclosure includes:

providing a substrate with a first side and a second side which are opposite to each other, and machining a temporary bearing surface on a surface of the second side of the substrate, where the substrate is provided with a packaging cavity and a first inner signal line layer, the packaging cavity extends across the first side and the second side of the substrate which are opposite to each other, the first inner signal line layer is partially or completely arranged on a surface of the first side of the substrate, an isolating layer is arranged between the first inner signal line layer and the surface of the second side of the substrate, and the temporary bearing surface covers the packaging cavity;

mounting a chip to be packaged in the packaging cavity and wire-bonding the chip with the first inner signal line layer, where an active face of the chip faces the first side of the substrate, and a passive surface of the chip is connected with the temporary bearing surface;

machining a first conductive metal column on the first side of the substrate, and packaging the first conductive metal column by a second insulating dielectric material to form a packaging layer, where the first conductive metal column is connected with the first inner signal line layer;

removing the temporary bearing surface; and machining an outer signal line layer on a surface of the packaging layer and machining a heat dissipation metal face on a surface of the isolating layer, where the outer signal line layer is connected with the first conductive metal column, and the heat dissipation metal face is connected with the passive face of the chip.

The manufacturing method of a signal-heat separated TMV packaging structure according to the embodiment of the disclosure at least has the following beneficial effects.

The chip is mounted in the packaging cavity, which is beneficial to realize higher-density integrated packaging. The heat dissipation metal face and the second inner signal line layer are separated by the isolating layer, which can realize signal and heat separation, and greatly improve the heat dissipation effect.

According to some embodiments of the disclosure, the first inner signal line layer includes a plurality of line layers, where one of the line layers is arranged on a surface of the first side of the substrate, the other line layers are embedded in the substrate, and the plurality of line layers are connected by metal columns;

or, the first inner signal line layer includes a single line layer, and the single line layer is arranged on the surface of the first side of the substrate.

According to some embodiments of the disclosure, the machining a first conductive metal column on the first side of the substrate includes:

mounting the first conductive metal column on the first side of the substrate at a position corresponding to the first inner signal line layer; and welding the first conductive metal column with the first inner signal line layer through a tin solder.

According to some embodiments of the disclosure, the machining a first conductive metal column on the first side of the substrate includes:

machining a photosensitive mask on the first side of the substrate, where the photosensitive mask is provided with a window adapted to the first conductive metal column;

electroplating the substrate to form the first conductive metal column in the window; and removing the photosensitive mask.

In a fourth aspect, A signal-heat separated TMV packaging structure according to the embodiment of the disclosure is prepared by the manufacturing method of a signal-heat separated TMV packaging structure above.

Part of the additional aspects and advantages of the disclosure will be given in part in the following description, and will become apparent in part from the following description, or will be learned through the practice of the disclosure.

BRIEF DESCRIPTION OF THE DRAWINGS

The above and/or additional aspects and advantages of the disclosure will be more apparent from the following description of the embodiments in conjunction with the accompanying drawings, where.

DETAILED DESCRIPTION

The embodiments of the disclosure are described below in detail. Examples of the embodiments are shown in the accompanying drawings. The same or similar numerals represent the same or similar elements or elements having the same or similar functions throughout the specification. The embodiments described below with reference to the accompanying drawings are exemplary, and are only used to explain the disclosure but should not be construed as a limitation to the disclosure.

In the description of the disclosure, "several" means one or more, "a plurality of" means two or more, "greater than a number", "less than a number", "exceed a number" and the like indicate that the number is excluded, and "above a number", "below a number", "within a number", and the like indicate that the number is included. "First" and "second" if described are only used to distinguish between technical features but cannot be used to indicate or imply relative importance or implicitly specify a quantity of indicated technical features or implicitly specify a sequential relationship of indicated technical features.

In the description of the present invention, it should be noted that unless otherwise explicitly defined, words such as "setting", "connection", "electrically-conductive connection" and "thermally-conductive connection" should be understood a broad sense, and those skilled in the art can reasonably determine the specific meanings of the above words in the present invention in combination with the specific contents of the technical solutions.

Example Embodiment One

Figure 1:
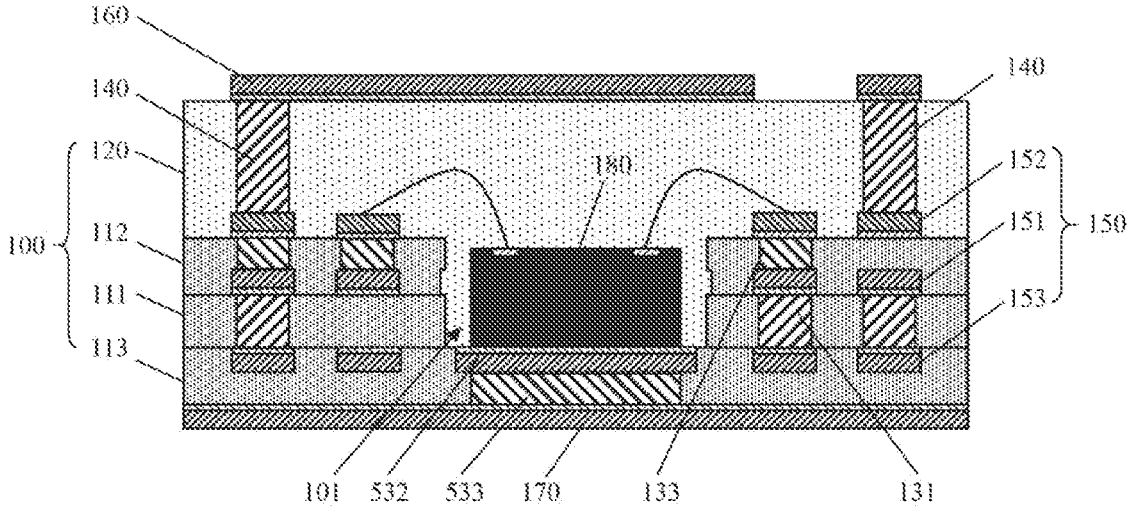
FIG. 1 is a first sectional view of a signal-heat separated TMV packaging structure according to example embodiment one of the disclosure.

Referring to FIG. 1, this embodiment discloses a signal-heat separated TMV packaging structure, including an insulating dielectric material 100, an inner signal line layer 150, an outer signal line layer 160, a heat dissipation metal face 170 and a chip 180.

FIG. 1 illustrates a schematic cross-sectional structure of the insulating dielectric material 100 in a thickness direction thereof. The insulating dielectric material 100 of this embodiment has a first side and a second side which are opposite to each other, the insulating dielectric material 100 includes a plurality of insulating layers laminated in sequence, and the insulating layers are coated or laminated with a first insulating dielectric material. The plurality of insulating layers includes a first insulating layer, a second insulating layer, . . . , and an $N^{th}$ insulating layer, and N is an integer greater than 1. The $N^{th}$ insulating layer, the first insulating layer, the second insulating layer, . . . , and the $(N-1)^{th}$ insulating layer are sequentially laminated from the first side to the second side of the insulating dielectric material 100. Three first insulating dielectric materials 100 are provided in this embodiment, that is, the plurality of insulating layers include a first insulating layer 111, a second insulating layer 112 and a third insulating layer 113, where the third insulating layer 113 is arranged at the first side of the insulating dielectric material 100 and served as the isolating layer. The plurality of first insulating dielectric materials define a packaging cavity 101. The packaging cavity 101 is used for accommodating the chip 180, and the insulating dielectric material 100 further includes a packaging layer 120. The packaging layer 120 covers the adjacent insulating layer, that is, the $(N-1)^{th}$ insulating layer, and is filled in the packaging cavity 101, and wraps around the chip 180. The packaging layer 120 is obtained by packaging with the second insulating dielectric material, and the packaging layer 120 is configured for packaging the chip 180 in the packaging cavity 101. In this way, the chip 180 can be embedded in the insulating dielectric material 100, which is beneficial to realize higher-density integrated packaging.

Figure 2:
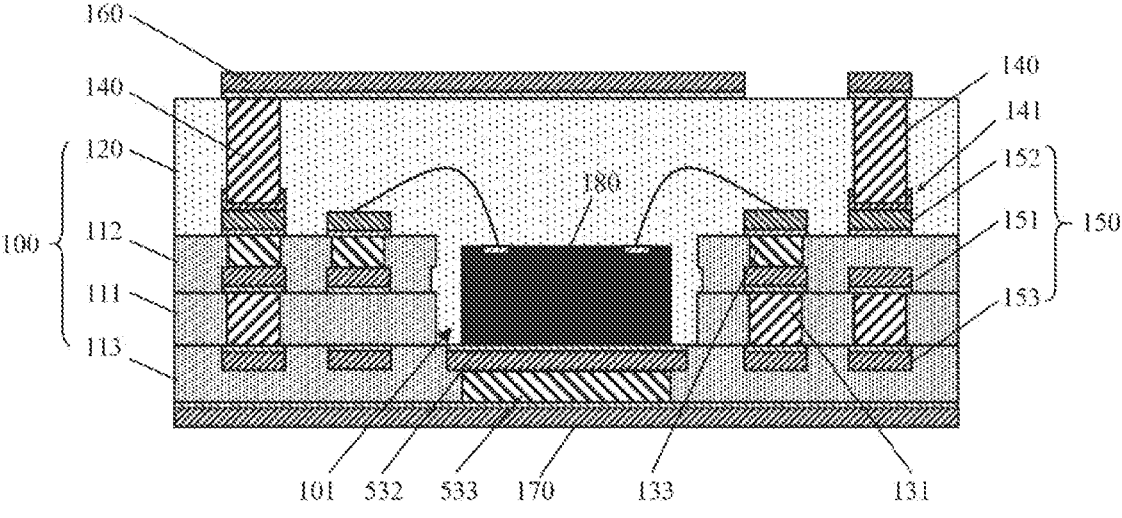
FIG. 2 is a second sectional view of the signal-heat separated TMV packaging structure according to example embodiment one of the disclosure.

The inner signal line layer 150 is arranged in the insulating dielectric material 100. The outer signal line layer 160 is arranged on a surface of the second side of the insulating dielectric material 100, and is connected with the inner signal line layer 150 through a TMV structure. The inner signal line layer 150 includes a first inner signal line layer and a second inner signal line layer 153. A plurality of the first inner signal line layers are provided, and the plurality of the first inner signal line layers include a first line layer, a second line layer, . . . , and an $M^{th}$ line layer, where M is an integer greater than 1. The second inner signal line layer, the first line layer, the second line layer, . . . , and the $M^{th}$ line layer are sequentially laminated from the first side to the second side of the insulating dielectric material 100. The first inner signal line layers are provided with two layers in this embodiment, that is, the plurality of the first inner signal line layers include a first line layer 151 and a second line layer 152. The second inner signal line layer 153 and the first line layer 151 are connected through a first metal column 131, the first line layer 151 and the second line layer 152 are connected through a second metal column 133, and so on. Conductive structures such as the first metal column 131 and the second metal column 133 may be used as the second conductive metal column for electrically-conductive connection between different line layers, that is, the adjacent inner signal line layers 150 are connected through the second conductive metal column. In this embodiment, a conventional Via hole or a first conductive metal column may be employed as the TMV structure. In the conventional TMV structure, the Via hole is formed by laser and electroplating, which can carry out signal transmission in the packaging layer 120, thus realizing signal transmission between the outer signal line layer 160 and the inner signal line layer 150. However, upper and lower apertures of the Via hole are quite different, which is difficult to form a solid conductive structure, and a wall of the hole is rough. In order to improve the conductivity of the TMV structure, a metal column structure, which is the first conductive metal column 140, is employed as the TMV structure. The first conductive metal column 140 and the second conductive metal column in this embodiment are both solid copper columns, which can achieve almost the same upper and lower apertures and have smooth surfaces. Compared with the conventional Via hole, the solid copper column has a smaller signal loss, shorter signal transmission delay and better conductivity. The first conductive metal column 140 of this embodiment may be obtained by a copper column method or a metal column mounting method. Referring to FIG. 1, when the first conductive metal column 140 is obtained by the copper column method, the first conductive metal column 140 is directly connected with the inner signal line layer 150. Referring to FIG. 2, when the first conductive metal column 140 is obtained by the metal column mounting method, a tin solder 141 is connected between the first conductive metal column 140 and the inner signal line layer 150. To avoid repetition, please refer to the example embodiment five for the specific machining method of the first conductive metal column 140.

The heat dissipation metal face 170 is arranged on a surface of the first side of the insulating dielectric material 100, where the heat dissipation metal face 170 and the inner signal line layer 150 are separated through the isolating layer. The chip 180 is provided with an active face and a passive face which are opposite to each other, the chip 180 is embedded in the insulating dielectric material 100, the active face of the chip 180 is in electrically-conductive connection with the inner signal line layer 150, and the passive face of the chip 180 is in heat transfer connection with the heat dissipation metal face 170. When in use, the outer signal line layer 160 is configured for soldering with a PCB, so that wiring areas of the surfaces of the first side and the second side of the insulating dielectric material 100 can be fully utilized, which is beneficial for increasing an area of the heat dissipation metal face 170. It is conceivable that the active face of the chip 180 is provided with signal pins, and the signal pins of the chip 180 are electrically connected with the inner signal line layer 150 by wire-bonding. A thermally-conductive metal is connected between the passive surface of the chip 180 and the heat dissipation metal face 170, and the heat generated by the chip 180 in the working process is transferred to the heat dissipation metal face 170 through the thermally-conductive metal. The heat dissipation metal face 170 is a copper skin covering the surface of the first side of the insulating dielectric material 100, which has a larger heat-dissipating area and can improve the heat dissipation efficiency of the chip 180. Furthermore, the heat dissipation metal face 170 and the inner signal line layer 150 are isolated by the isolating layer, which can separate the signal layer from the heat dissipation layer, thereby realizing heat and signal separation, avoiding the limited heat dissipation area caused by the co-layer of the signal layer and the heat dissipation layer, and greatly improving the heat dissipation effect. In this embodiment, the thermally-conductive metal includes a thermally-conductive metal face 532 and a thermally-conductive metal column 533. A first side of the thermally-conductive metal face 532 is connected with the passive surface of the chip 180, and a second side of the thermally-conductive metal face 532 is connected with the heat dissipation metal face 170 through the thermally-conductive metal column 533. The thermally-conductive metal face 532 may adapt to the chips 180 with different areas and transfer the heat generated by the chips 180. The thermally-conductive metal column 533 may transfer the heat of the thermally-conductive metal face 532 to the heat dissipation metal face 170, and a thickness of the thermally-conductive metal column 533 may be adjusted according to thicknesses of different isolating layers, which can address the problem of the thickness limitation of the thermally-conductive metal face 532.

Example Embodiment Two

Figure 3:
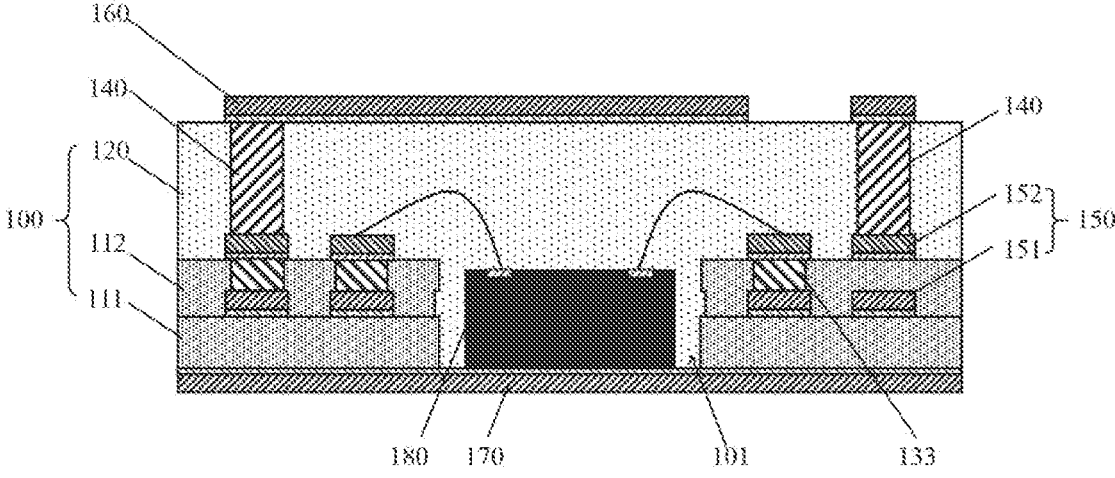
FIG. 3 is a first sectional view of a signal-heat separated TMV packaging structure according to example embodiment two of the disclosure.

Referring to FIG. 3, this embodiment discloses a signal-heat separated TMV packaging structure, including an insulating dielectric material 100, an inner signal line layer 150, an outer signal line layer 160, a heat dissipation metal face 170 and a chip 180.

FIG. 3 illustrates a schematic cross-sectional structure of the insulating dielectric material 100 in a thickness direction thereof. The insulating dielectric material 100 has a first side and a second side which are opposite to each other, the insulating dielectric material 100 includes a plurality of insulating layers, and the insulating layers are coated or laminated with a first insulating dielectric material. The plurality of insulating layers includes a first insulating layer, a second insulating layer, . . . , and an $L^{th}$ insulating layer, and L is an integer greater than or equal to 1. The first insulating layer, the second insulating layer, . . . , and the $L^{th}$ insulating layer are sequentially laminated from the first side to the second side of the insulating dielectric material 100. Two insulating layers are provided in this embodiment, that is, the plurality of insulating layers include a first insulating layer 111 and a second insulating layer 112, where the first insulating layer 111 is arranged at the first side of the insulating dielectric material 100 and served as the isolating layer. The plurality of insulating layers define a packaging cavity 101. The packaging cavity 101 is configured for accommodating the chip 180, and the insulating dielectric material 100 further includes a packaging layer 120. The packaging layer 120 covers the adjacent insulating layer, that is, the L$^{th}$ insulating layer, is filled in the packaging cavity 101, and wraps around the chip 180. The packaging layer 120 is obtained by packaging with the second insulating dielectric material, and the packaging layer 120 is configured for packaging the chip 180 in the packaging cavity 101. In this way, the chip 180 can be embedded in the insulating dielectric material 100, which is beneficial to realize higher-density integrated packaging.

Figure 4:
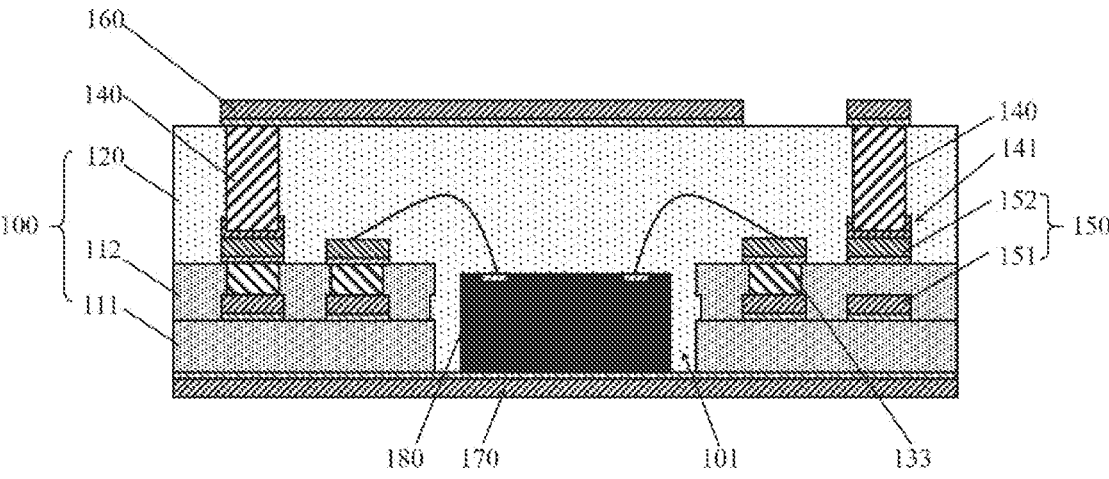
FIG. 4 is a second sectional view of the signal-heat separated TMV packaging structure according to example embodiment two of the disclosure.

The inner signal line layer 150 is arranged in the insulating dielectric material 100. The outer signal line layer 160 is arranged on a surface of the second side of the insulating dielectric material 100, and is connected with the inner signal line layer 150 through a TMV structure. The inner signal line layer 150 in this embodiment includes a plurality of first inner signal line layers, and the plurality of the first inner signal line layers include a first line layer, a second line layer, . . . , and an M$^{th}$ line layer, where M is an integer greater than or equal to 1. The first line layer, the second line layer, . . . , and the M$^{th}$ line layer are sequentially laminated from the first side to the second side of the insulating dielectric material 100. The first inner signal line layers are provided two layers in this embodiment, that is, the plurality of the first inner signal line layers include a first line layer 151 and a second line layer 152. The first line layer 151 and the second line layer 152 are connected through a second metal column 133, the second line layer 152 and the third line layer (not shown in the figure) are connected through a third metal column (not shown in the figure), and so on. Conductive structures such as the second metal column 133 and the third metal column may be used as the second conductive metal column for electrically-conductive connection between different line layers, that is, the adjacent inner signal line layers 150 are connected through the second conductive metal column. It should be noted that the TMV structure of this embodiment is the same as that of the example embodiment one, and will not be elaborated in this embodiment. The first conductive metal column 140 and the second conductive metal column in this embodiment are both solid copper columns, which can achieve almost the same upper and lower apertures and have smooth surfaces. Compared with the conventional Via hole, the solid copper column has a smaller signal loss, shorter signal transmission delay and better conductivity. The first conductive metal column 140 of this embodiment may be obtained by a copper column method or a metal column mounting method. Referring to FIG. 3, when the first conductive metal column 140 is obtained by the copper column method, the first conductive metal column 140 is directly connected with the inner signal line layer 150. Referring to FIG. 4, when the first conductive metal column 140 is obtained by the metal column mounting method, a tin solder 141 is connected between the first conductive metal column 140 and the inner signal line layer 150. To avoid repetition, please refer to the example embodiment five for the specific machining method of the first conductive metal column 140.

The heat dissipation metal face 170 is arranged on a surface of the first side of the insulating dielectric material 100, where the heat dissipation metal face 170 and the inner signal line layer 150 are separated through the isolating layer. The chip 180 is provided with an active face and a passive face which are opposite to each other, the chip 180 is embedded in the insulating dielectric material 100, the active face of the chip 180 is in electrically-conductive connection with the inner signal line layer 150, and the passive face of the chip 180 is in heat transfer connection with the heat dissipation metal face 170. When in use, the outer signal line layer 160 is configured for soldering with a PCB, so that wiring areas of the surfaces of the first side and the second side of the insulating dielectric material 100 can be fully utilized, which is beneficial for increasing an area of the heat dissipation metal face 170. It is conceivable that the active face of the chip 180 is provided with signal pins, and the signal pins of the chip 180 are electrically connected with the inner signal line layer 150 by wire-bonding. The passive surface of the chip 180 is directly contacted with the heat dissipation metal face 170, and the heat generated by the chip 180 in the working process is transferred to the heat dissipation metal face 170 through the thermally-conductive metal. The heat dissipation metal face 170 is a copper skin covering the surface of the first side of the insulating dielectric material 100, which has a larger heat-dissipating area and can improve the heat dissipation efficiency of the chip 180. Furthermore, the heat dissipation metal face 170 and the inner signal line layer 150 are isolated by the isolating layer, which can separate the signal layer from the heat dissipation layer, thereby realizing heat and signal separation, avoiding the limited heat dissipation area caused by the co-layer of the signal layer and the heat dissipation layer, and greatly improving the heat dissipation effect. It should be noted that the contents not involved in this embodiment may refer to the example embodiment one.

Example Embodiment Three

This embodiment discloses a signal-heat separated TMV packaging structure (not shown in the figure), including an insulating dielectric material 100, an inner signal line layer 150, an outer signal line layer 160, a heat dissipation metal face 170 and a chip 180. Different from the example embodiment two, the insulating dielectric material 100 of this embodiment includes an insulating layer and a packaging layer 120. The insulating layer is a single-layer or multi-layer structure, and the inner signal line layer 150 is a single-layer structure (not shown in the figure). The inner signal line layer 150 is arranged on the insulating layer and located at a junction with the packaging layer.

Example Embodiment Four

This embodiment provides a manufacturing method of a substrate, including steps S010 to S090. Each step will be described in detail below.

Figure 5:
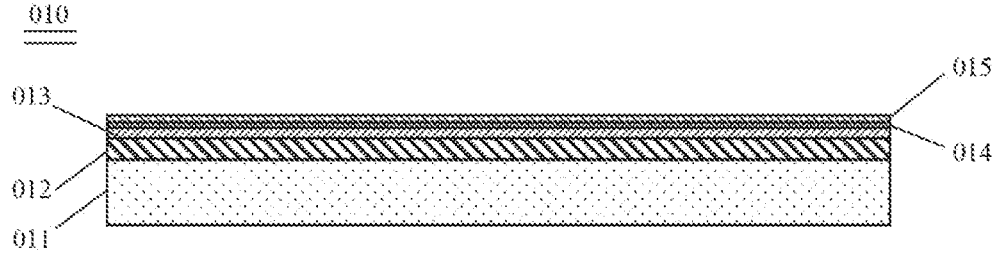
FIG. 5 to FIG. 19 are schematic structural diagrams of intermediate processes of a substrate manufacturing method according to example embodiment four of the disclosure.

At S10, referring to FIG. 5, a bearing plate 010 is provided, where the bearing plate 010 includes a core layer 011, a first metal layer 012, a second metal layer 013, an etching barrier layer 014 and a first metal seed layer 015, where the first metal layer 012 and the second metal layer 013 may be copper layers, which may be physically combined and can be separated. After the first metal layer 012 and the second metal layer 013 are separated, an etching process is needed. The etching barrier layer 014 can protect lines of the substrate and metal columns from over-etching. The etching barrier layer 014 may be a nickel layer, and the first metal seed layer 015 may be a copper layer, which is used as a conduction basis for subsequent electroplating.

Figure 6:
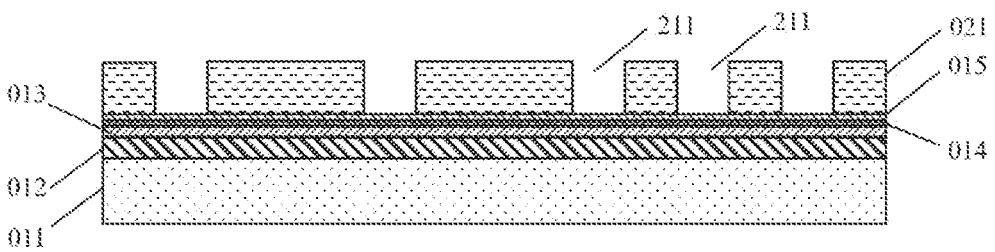
Figure 7:
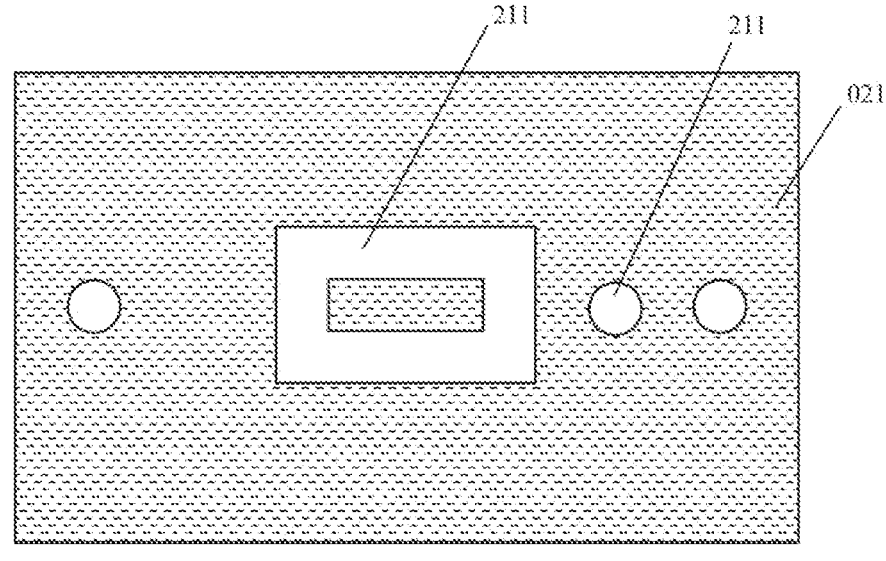

At S020, referring to FIG. 6, a first photoresist 021 is applied on the bearing plate 010, and a first metal column layer is obtained by opening windows through the first photoresist 021 and conducting electroplating. The first metal column layer of this embodiment is obtained by a copper column method, where the first photoresist 021 may be obtained by pasting or coating, and the method of opening windows in the first photoresist 021 may include processes of exposure and development. According to different actual application requirements, the first metal column layer may include a first metal column 131 and a first sacrificial metal column 132, or the first metal column layer includes the first sacrificial metal column 132, with the first metal column 131 omitted. FIG. 7 illustrates a top view structure of the windows in the first photoresist 021. It should be understood that the first metal column layer of this embodiment is a copper column layer, and shapes of the windows 211 in the first photoresist 021 are adapted respectively with the first metal column 131 and the first sacrificial metal column 132.

Figure 8:
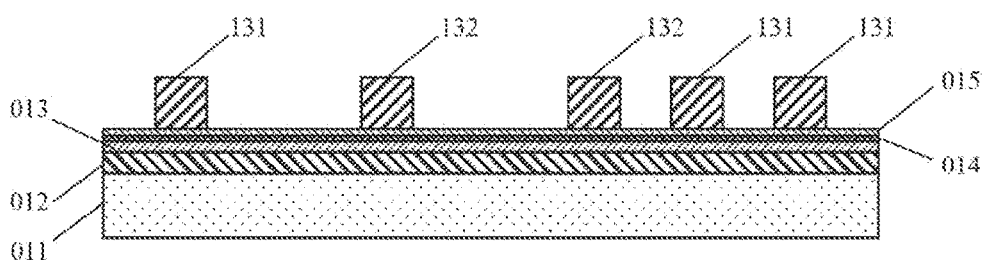
Figure 9:
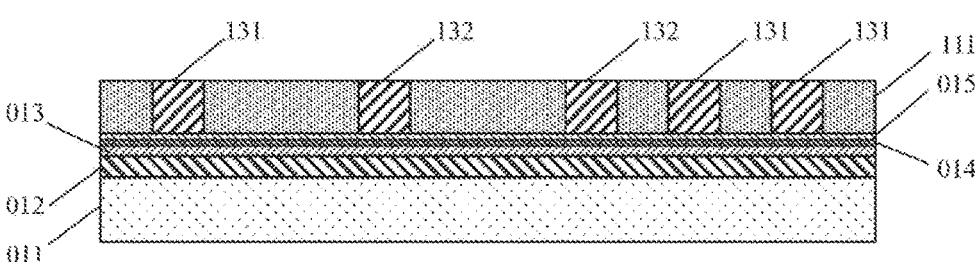

At S030, referring to FIG. 7, FIG. 8 and FIG. 9, the first photoresist 021 is removed and a first insulating dielectric material is applied to form a first insulating layer 111. The first insulating dielectric material may be pure resin or an organic insulating material containing resin and glass fiber, and the first insulating dielectric material may be applied on the first metal column layer by coating or pressing to form the first insulating layer 111.

Figure 10:
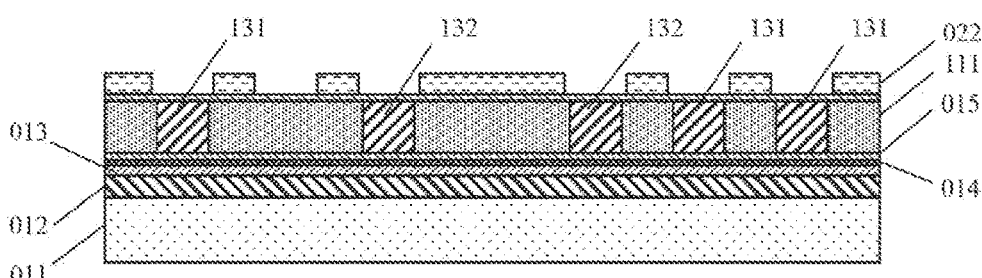
Figure 11:
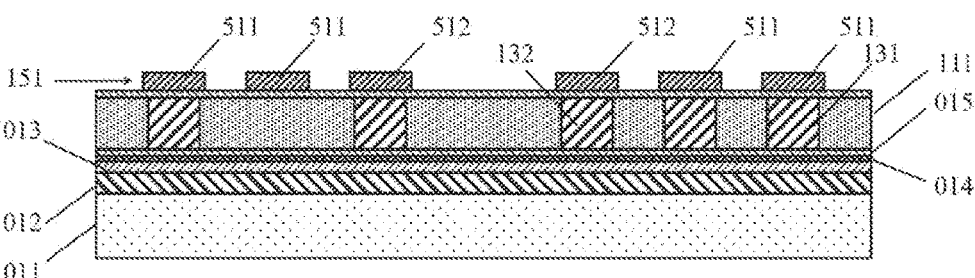

At S040, referring to FIG. 9, FIG. 10 and FIG. 11, after thinning the first insulating layer 111, a second photoresist 022 is applied on the first insulating layer 111, and a first line layer 151 is obtained by opening windows in the second photoresist 022 and conducting electroplating. Corresponding to step S020, the first line layer 151 may include a first conductive line 511 and a first sacrificial line 512, the first sacrificial line 512 is connected with the first sacrificial metal column 132, or the first line layer 151 may includes the first sacrificial line 512, with the first conductive line 511 omitted. It should be noted that when the first metal column 131 is provided, the first conductive line 511 may be connected with the first metal column 131.

Figure 12:
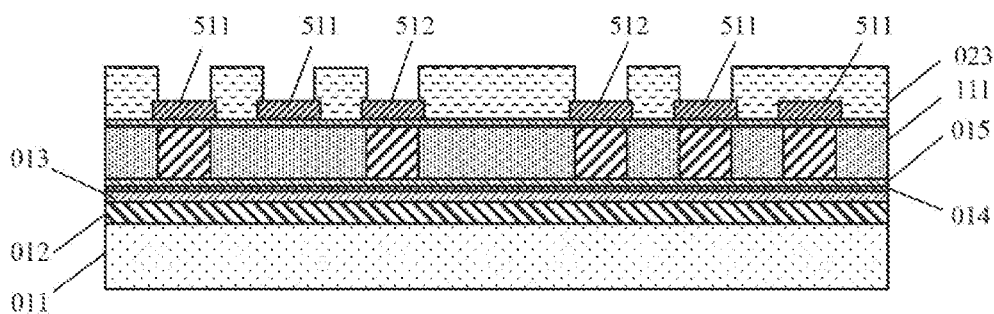
Figure 13:
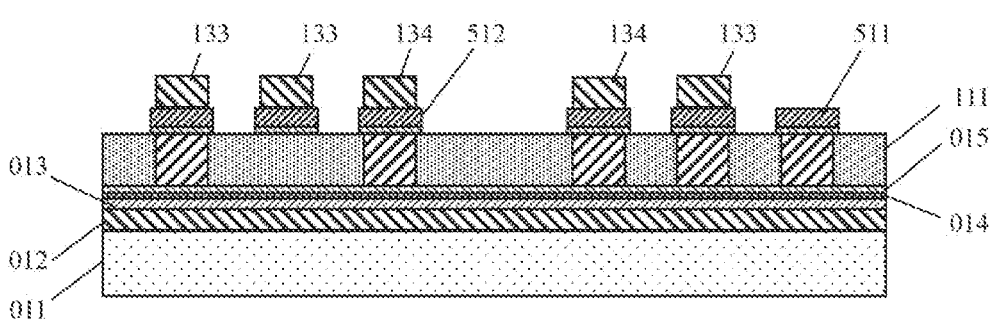

At S050, referring to FIG. 12 and FIG. 13, a third photoresist 023 is applied on the first line layer 151, and a second metal column layer is obtained by opening windows in the third photoresist 023 and conducting electroplating. Corresponding to the first metal column layer, the second metal column layer includes a second metal column 133 and a second sacrificial metal column 134, or the second metal column layer includes the second sacrificial metal column 134, with the second metal column 133 omitted.

Figure 14:
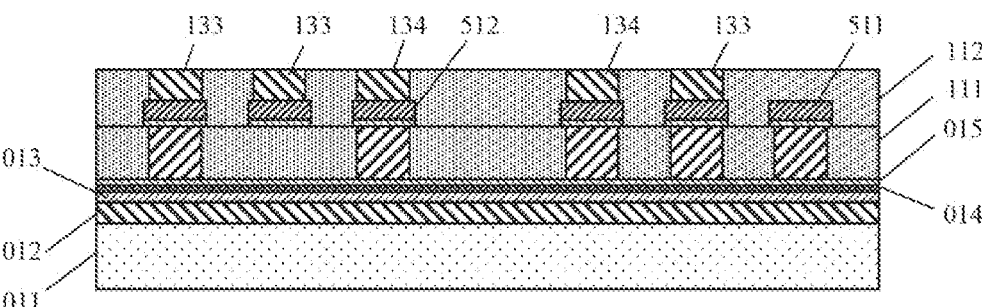

At S060, referring to FIG. 13 and FIG. 14, the third photoresist 023 is removed and a first insulating dielectric material is applied to form a second insulating layer 112.

At S070, the steps S030 to S060 are repeated until the number of layers of the substrate meets the requirements of production means. It should be noted that the sacrificial lines serve to facilitate the machining and alignment of the next layer of sacrificial metal column. Therefore, the sacrificial lines may be omitted on the last line layer. For example, referring to FIG. 15, when the second line layer 152 is the last line layer, the second line layer 152 includes the second conductive line, with the second sacrificial line omitted.

Figure 15:
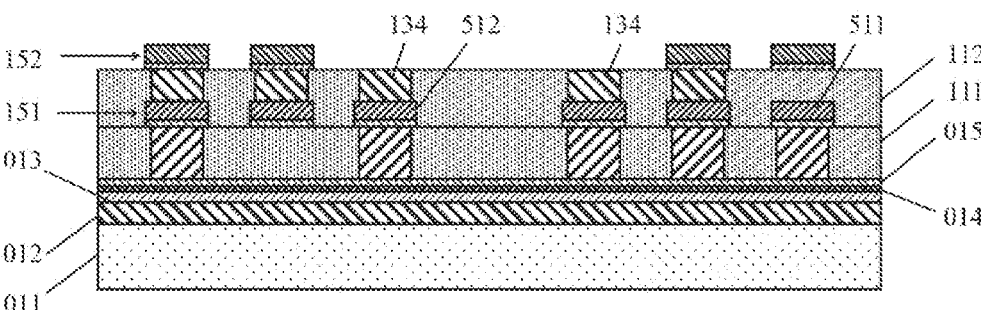
Figure 16:
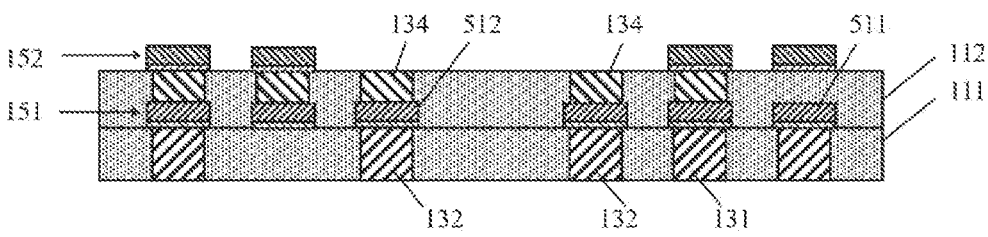
Figure 17:
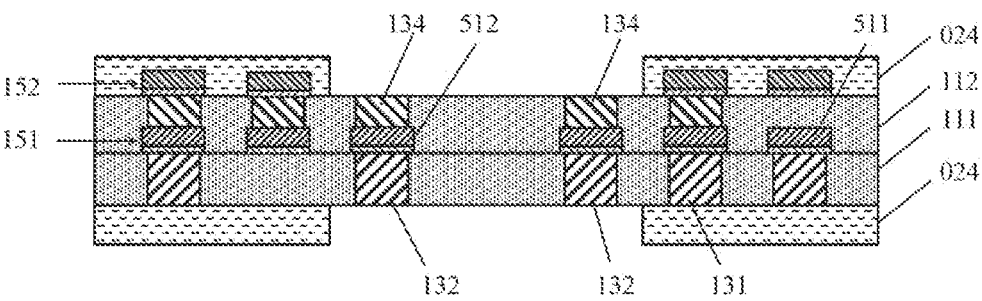

At S080, referring to FIG. 15, FIG. 16 and FIG. 17, after the bearing plate 010 is separated, the sacrificial line and the sacrificial metal column are etched to form a packaging cavity 101. It should be noted that a fourth photoresist 024 may be applied in the etching process to protect parts that do not need etching.

Figure 18:
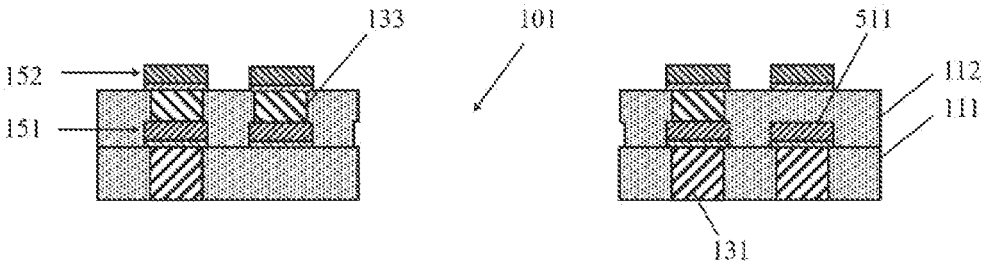
Figure 19:
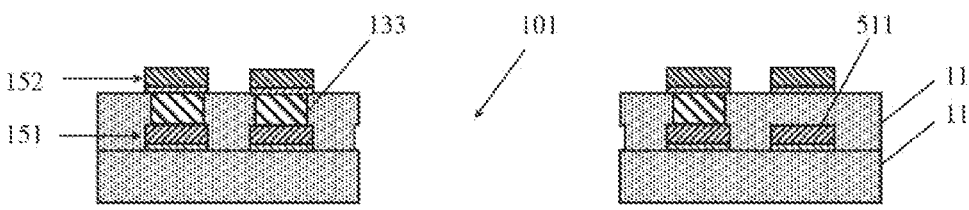

At S090, after removing the fourth photoresist 024, the substrate is obtained. It should be noted that the first metal column 131 may be arranged on the substrate (as shown in FIG. 18), or the first metal column 131 may be omitted (as shown in FIG. 19) according to different actual application requirements.

Example Embodiment Five

This embodiment provides a manufacturing method of a signal-heat separated TMV packaging structure, including steps S110 to S160. Each step will be described in detail below.

Figure 20:
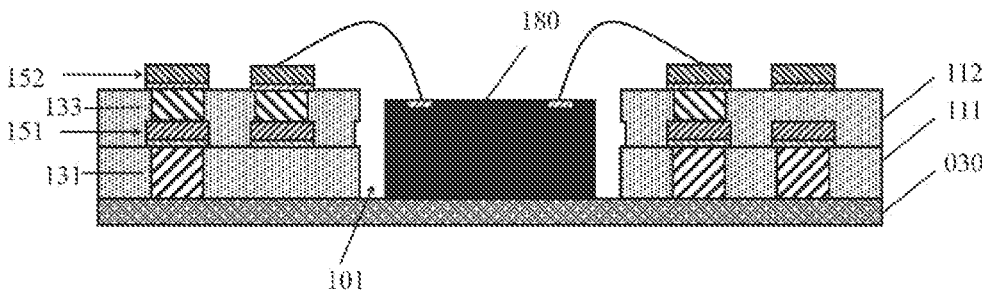
FIG. 20 to FIG. 26 are schematic structural diagrams of intermediate processes of a substrate manufacturing method according to example embodiment five of the disclosure.

At S110, referring to FIG. 20, a substrate is provided, where the substrate has a first side and a second side which are opposite to each other, and a temporary bearing surface 030 is machined on a surface of the second side of the substrate.

The manufacturing method of the substrate may refer to the example embodiment four. It may be known from the manufacturing method of the example embodiment four that the substrate includes a first insulating layer, a second insulating layer, . . . , and an $(N-1)^{th}$ insulating layer, where N is an integer greater than 1. In this embodiment, the substrate is provided with a packaging cavity 101, a first inner signal line layer and a first metal column 131. The packaging cavity 101 extends across the first side and the second side of the substrate which are opposite to each other, the first inner signal line layer is partially or completely arranged on a surface of the first side of the substrate, a first end of the first metal column 131 is in electrically-conductive connection with the first inner signal line layer, a second end of the first metal column 131 is exposed to the surface of the second side of the substrate, and the temporary bearing surface 030 covers the packaging cavity 101. It should be noted that the first inner signal line layer includes a first line layer, a second line layer, . . . , and an $M^{th}$ line layer, where M is an integer greater than or equal to 1. The first line layer is connected with the first metal column 131, and the second line layer is connected with the first line layer through a second metal column 133. By analogy, the $M^{th}$ line layer and the $(M-1)^{th}$ line layer are connected by an $M^{th}$ metal column, and the conductive structures such as the first metal column 131, the second metal column 133, . . . , and the $M^{th}$ metal column may be used as the second conductive metal columns for electrically-conductive connection between different line layers, that is, the first inner signal line layer includes a plurality of line layers, where one of the line layers is arranged on a surface of the first side of the substrate, the other line layers are embedded in the substrate, and the plurality of line layers are connected by metal columns. Alternatively, the first inner signal line layer includes a single line layer, and the single line layer is arranged on the surface of the first side of the substrate. For convenience of description, the first inner signal line layer of this embodiment includes a first line layer 151 and a second line layer 152.

In this embodiment, the machining method of the temporary bearing surface 030 may be obtained by sticking adhesive tape or adhesive plaster, and the temporary bearing surface 030 may provide support for mounting the chip 180, and expose the passive surface of the chip 180 after the subsequent packaging.

At S120, the chip 180 to be packaged is mounted in the packaging cavity 101 and wire-bonded with the second inner signal line layer, where an active face of the chip 180 faces the first side of the substrate, and the passive surface of the chip 180 is connected with the temporary bearing surface 030. It should be noted that the first inner signal line layer wire-bonded with the chip 180 is the outermost line layer of the substrate, that is, the M$^{th}$ line layer.

Figure 21:
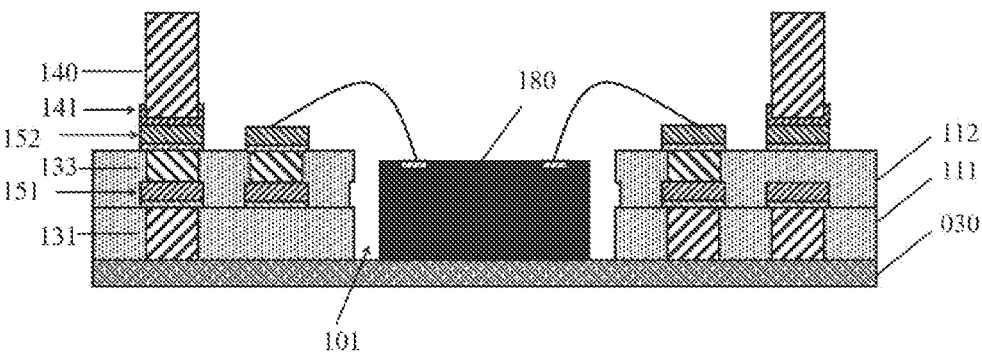
Figure 22:
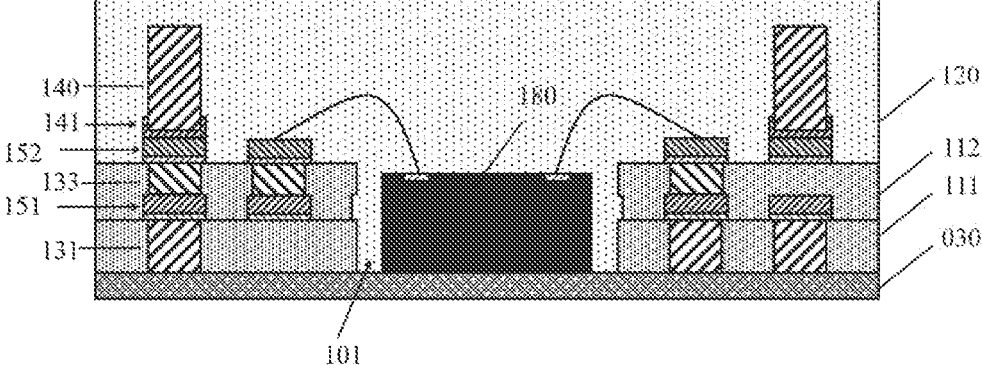

At S130, referring to FIG. 20, FIG. 21 and FIG. 22, a first conductive metal column 140 is machined on the first side of the substrate, and the chip is packaged by a second insulating dielectric material to form a packaging layer 120, where the first conductive metal column 140 is connected with the first inner signal line layer.

The first conductive metal column 140 is used as a signal transmission structure between the first inner signal line layer and the outer signal line layer 160. The first conductive metal column 140 may be obtained by a metal column mounting method or a copper column method, which can make both ends of the first conductive metal column 140 have almost the same aperture and have smooth surfaces. Compared with the conventional Via hole, the solid copper column has a smaller signal loss, shorter signal transmission delay and better conductivity. Packaging the chip by the second insulating dielectric material can protect the chip 180 and provide a bearing for manufacturing the subsequent outer signal line layer 160.

Figure 23:
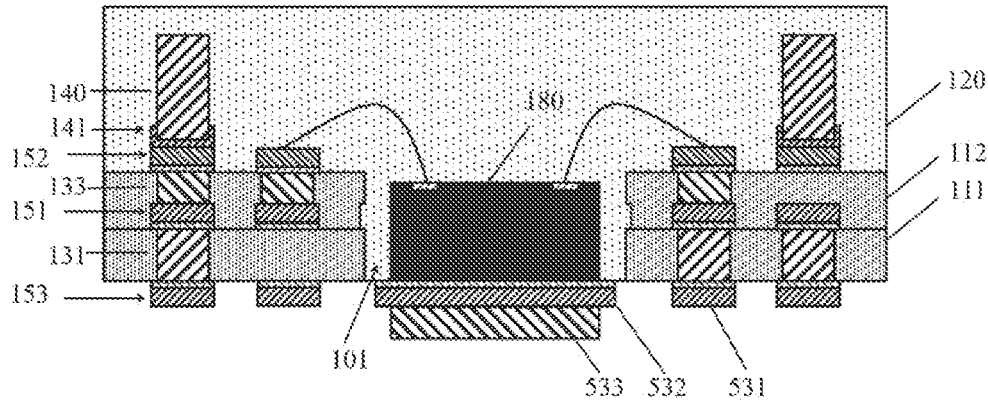

At S140, referring to FIG. 22 and FIG. 23, the temporary bearing surface 030 is removed, and a second inner signal line layer 153 is machined on a surface of the second side of the substrate. The second inner signal line layer 153 includes a second inner signal line 531 and a thermally-conductive metal face 532, the second inner signal line 531 is connected with the first metal column 131, and the thermally-conductive metal face 532 is connected with the passive face of the chip 180.

Machining the second inner signal line layer 153 on the surface of the second side of the substrate can meet the requirements on line layers of different packaging designs, and can make full use of the longitudinal space of the packaging body to realize high-density integration. The thermally-conductive metal face 532 is used for transferring heat generated by the chip 180.

Figure 24:
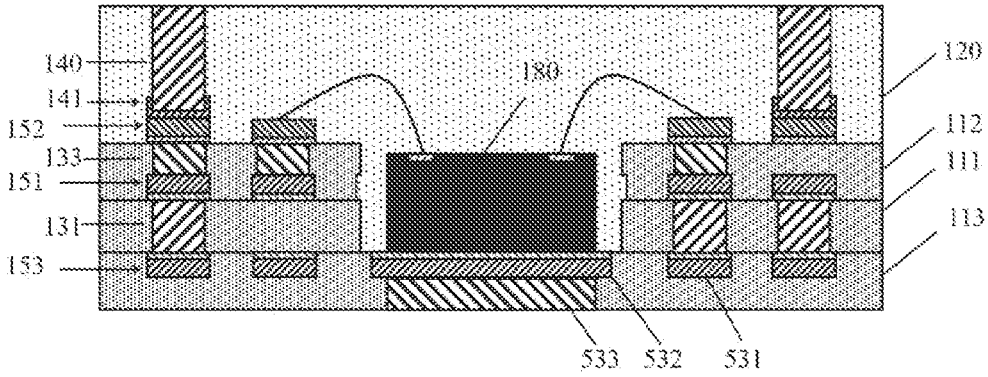

At S150, referring to FIG. 23 and FIG. 24, a thermally-conductive metal column 533 is machined on the thermally-conductive metal face 532 and laminated to form an isolating layer.

The thermally-conductive metal column 533 may be obtained by a copper column method, that is, by the steps of applying photoresist, and opening windows in the photoresist and conducting electroplating. After machining the thermally-conductive metal column 533, the first insulating dielectric material is laminated and pressed on the thermally-conductive metal column 533, and the first insulating dielectric material is formed into an N$^{th}$ insulating layer, which may be used as an isolating layer for separating the signal layer from the heat dissipation layer.

Figure 25:
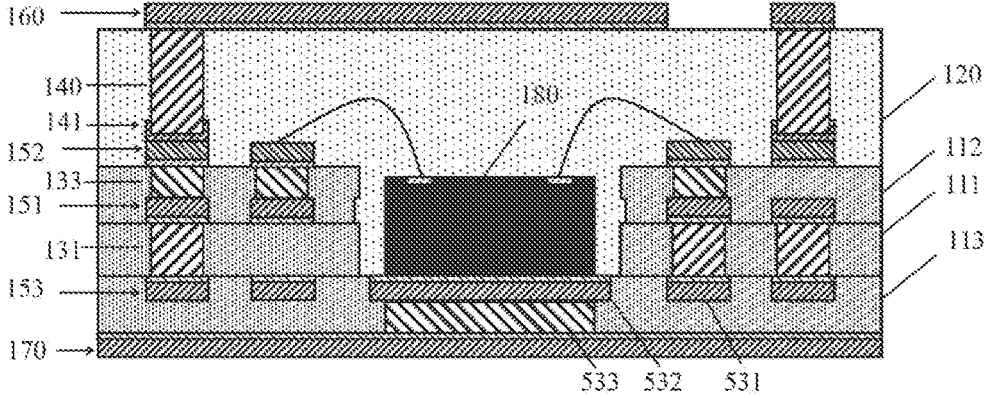

At S160, referring to FIG. 24 and FIG. 25, an outer signal line layer 160 is machined on a surface of the packaging layer 120 and a heat dissipation metal face 170 is machined on a surface of the isolating layer, where the outer signal line layer 160 is connected with the first conductive metal column 140, and the heat dissipation metal face 170 is connected with the thermally-conductive metal column 533.

It should be noted that in step S130, the second insulating dielectric material is higher than the first conductive metal column 140, so the packaging layer 120 needs to be thinned before machining the outer signal line layer 160. When in use, the outer signal line 160 may be welded with a PCB, and the heat dissipation metal face 170 covers a surface of the isolating layer, which has a large heat dissipation area, and is conducive to improving the heat dissipation efficiency. Moreover, the heat dissipation metal face 170 is separated from the inner signal line and the outer signal line 160, thus realizing signal and heat separation, avoiding limited heat dissipation area caused by the co-layer of the signal layer and the heat dissipation layer, and greatly improving the heat dissipation effect.

Therefore, in this embodiment, the chip 180 is mounted in the packaging cavity 101, which is beneficial to realize higher-density integrated packaging. The heat dissipation metal face 170 and the second inner signal line layer are separated by the isolating layer, which can realize signal and heat separation, and greatly improve the heat dissipation effect.

This embodiment provides two machining methods of the first conductive metal column 140, where the first machining method is as follows.

Referring to FIG. 25, "machining the first conductive metal column 140 on the first side of the substrate" in step S130 includes:

S131*a*: mounting the first conductive metal column 140 on the first side of the substrate at a position corresponding to the first inner signal line layer; and S131*b*: welding the first conductive metal column 140 with the second inner signal line layer through a tin solder 141.

By machining the first conductive metal column 140 in a mounting way, the first metal column 131 can have a regular shape and a smooth surface, which is conducive to improving the conductivity.

The second machining method is as follows.

Figure 26:
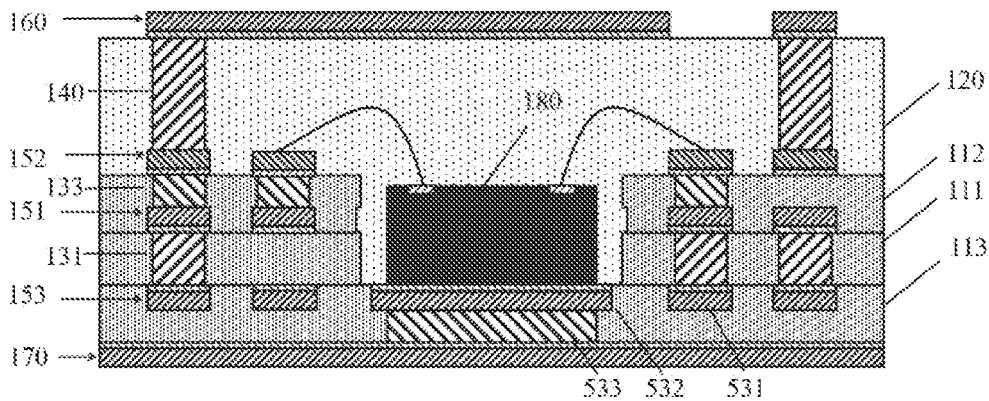

Referring to FIG. 26, "machining the first conductive metal column 140 on the first side of the substrate" in step S130 includes:

S132*a*: machining a photosensitive mask on the first side of the substrate, where the photosensitive mask is provided with a window adapted to the first conductive metal column 140. It should be noted that the function of the photosensitive mask is the same as that of the photoresist, which is used to protect the metal positions that do not need electroplating or etching;

S132*b*: electroplating the substrate to form the first conductive metal column 140 in the window; and S132*c*: removing the photosensitive mask.

Compared with the conventional Via hole method, the copper column method can obtain a solid copper column. The solid copper column has a smaller signal loss, shorter signal transmission delay and better conductivity.

Moreover, this embodiment further discloses a signal-heat separated TMV packaging structure which is prepared by the manufacturing method of a signal-heat separated TMV packaging structure above. The chip 180 is embedded in the substrate, which is beneficial to realize higher-density integrated packaging. The heat dissipation metal face 170 is separated from the inner signal line layer 150 by the isolating layer, which can realize signal and heat separation, and greatly improve the heat dissipation effect. The two ends of the first conductive metal column 140 are almost the same in size, and have smooth surfaces, smaller signal losses, shorter transmission delay and better conductivity.

Example Embodiment Six

This embodiment discloses a manufacturing method of a signal-heat separated TMV packaging structure, including steps S210 to S250.

Figure 27:
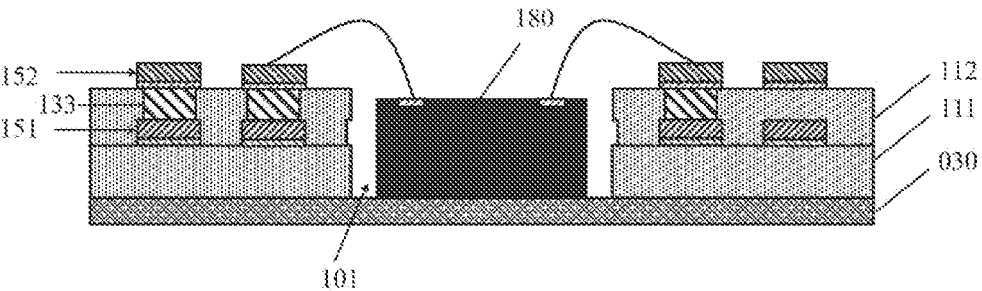
FIG. 27 to FIG. 32 are schematic structural diagrams of intermediate processes of a substrate manufacturing method according to example embodiment six of the disclosure.

At S210, referring to FIG. 27, a substrate is provided, where the substrate has a first side and a second side which are opposite to each other, and a temporary bearing surface 030 is machined on a surface of the second side of the substrate. The substrate is provided with a packaging cavity and a first inner signal line layer, the packaging cavity 101 extends across the first side and the second side of the substrate which are opposite to each other, the first inner signal line layer is partially or completely arranged on a surface of the first side of the substrate, an isolating layer is arranged between the first inner signal line layer and the surface of the second side of the substrate, and the temporary bearing surface 030 covers the packaging cavity 101.

Referring to FIG. 20 and FIG. 27, as in the example embodiment five, the first inner signal line layer of this embodiment may be a single-layer or multi-layer structure, that is, the first inner signal line layer includes a plurality of line layers, one of the line layers is arranged on a surface of the first side of the substrate, and the other line layers are embedded in the substrate, and the plurality of line layers are connected by metal columns. Alternatively, the first inner signal line layer includes a single line layer, and the single line layer is arranged on the surface of the first side of the substrate.

Different from the example embodiment five, the first metal column 131 is omitted from the substrate of this embodiment, and the manufacturing method of the substrate may refer to the example embodiment four. The substrate includes a first insulating layer, a second insulating layer, . . . , and an L$^{th}$ insulating layer, where L is an integer greater than or equal to 1. Two insulating layers are provided in this embodiment, that is, the substrate includes the first insulating layer 111 and the second insulating layer 112, where the first insulating layer 111 is used as an isolating layer for separating the signal layer from the heat dissipation layer.

At S220, the chip 180 to be packaged is mounted in the packaging cavity 101 and wire-bonded with the first inner signal line layer, where an active face of the chip 180 faces the first side of the substrate, and a passive surface of the chip 180 is connected with the temporary bearing surface 030.

Figure 28:
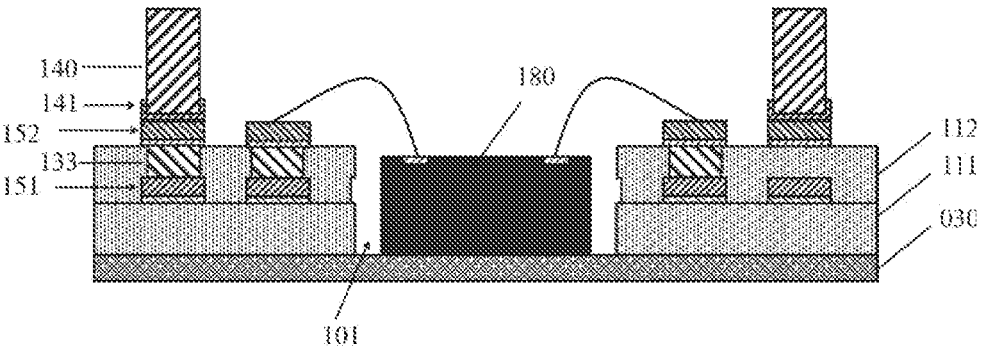
Figure 29:
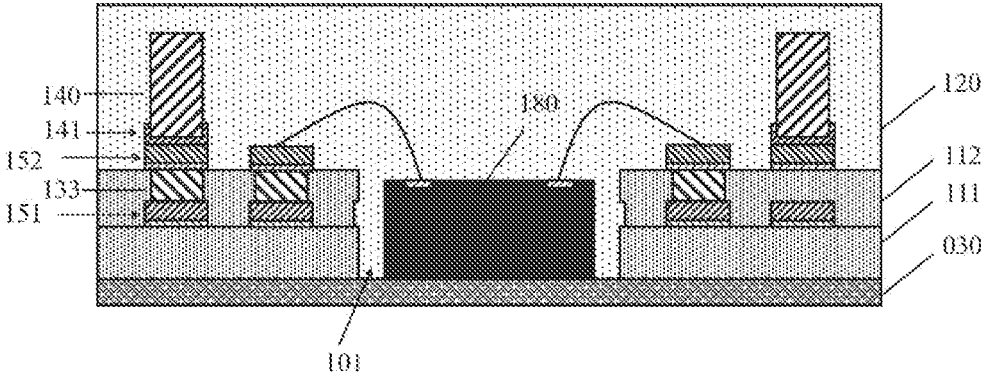
Figure 30:
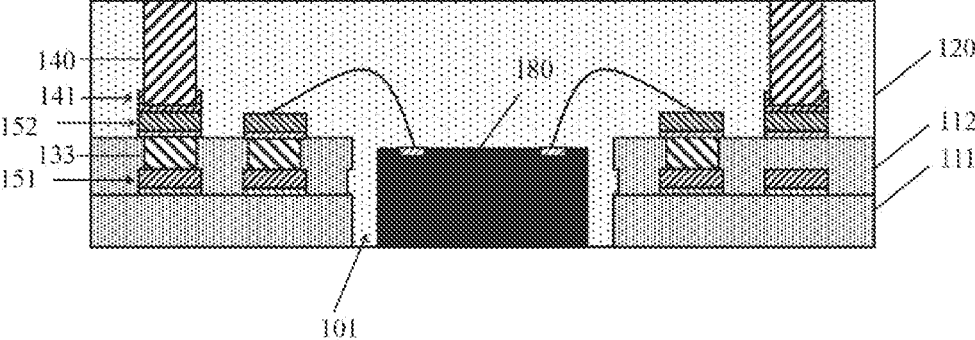

At S230, referring to FIG. 28 and FIG. 29, a first conductive metal column 140 is machined on the first side of the substrate, and packaged by a second insulating dielectric material to form a packaging layer 120, where the first conductive metal column 140 is connected with the first inner signal line layer.

At S240, referring to FIG. 29 and FIG. 20, the temporary bearing surface 030 is removed.

Figure 31:
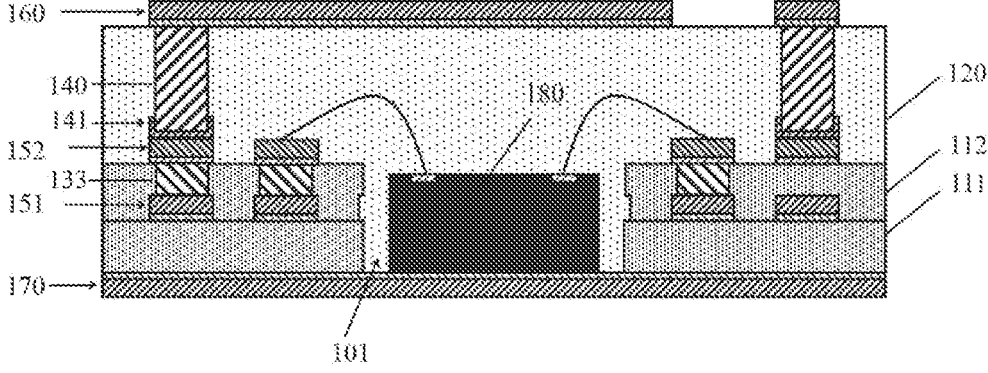

At S250, referring to FIG. 20 and FIG. 31, an outer signal line layer 160 is machined on a surface of the packaging layer 120 and a heat dissipation metal face 170 is machined on a surface of the isolating layer, where the outer signal line layer 160 is connected with the first conductive metal column 140, and the heat dissipation metal face 170 is connected with the passive face of the chip 180. Referring to FIG. 25 and FIG. 31, different from the example embodiment five, the thermally-conductive metal structures, i.e., the thermally-conductive metal face 532 and the thermally-conductive metal column 533 are omitted from this embodiment.

The chip 180 is mounted in the packaging cavity 101, which is beneficial to realize higher-density integrated packaging. The heat dissipation metal face 170 and the first inner signal line layer are separated by the isolating layer, which can realize signal and heat separation, and greatly improve the heat dissipation effect. It should be noted that the contents not involved in this embodiment may refer to the example embodiment one.

Figure 32:
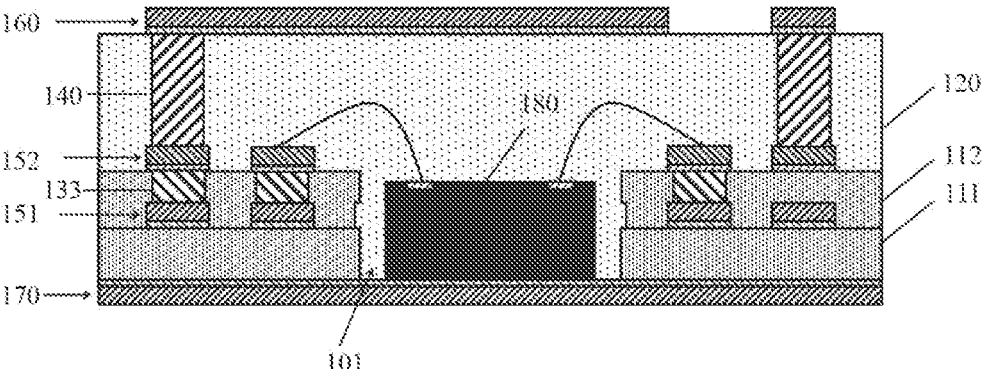

Referring to FIG. 31 and FIG. 32, as in the example embodiment five, the first conductive metal column 140 of this embodiment may similarly be obtained by two methods, which will not be elaborated in this embodiment.

Moreover, this embodiment further discloses a signal-heat separated TMV packaging structure which is prepared by the manufacturing method of a signal-heat separated TMV packaging structure above. The chip 180 is embedded in the substrate, which is beneficial to realize higher-density integrated packaging. The heat dissipation metal face 170 is separated from the inner signal line layer 150 by the isolating layer, which can realize signal and heat separation, and greatly improve the heat dissipation effect. The two ends of the first conductive metal column 140 are almost the same in size, and have smooth surfaces, smaller signal losses, shorter transmission delay and better conductivity.

The embodiments of the disclosure are described in detail with reference to the drawings above, but the disclosure is not limited to the above embodiments, and various changes may also be made within the knowledge scope of those of ordinary skills in the art without departing from the purpose of the disclosure.

The invention claimed is:

1. A signal-heat separated through-molding-via (TMV) packaging structure, comprising:
   an insulating dielectric material having a first side and a second side which are opposite to each other, wherein the first side of the insulating dielectric material is provided with an isolating layer;
   an inner signal line layer arranged in the insulating dielectric material;
   an outer signal line layer arranged on a surface of the second side of the insulating dielectric material and connected with the inner signal line layer through a TMV structure;
   a heat dissipation metal face arranged on a surface of the first side of the insulating dielectric material, wherein the heat dissipation metal face and the inner signal line layer are separated through the isolating layer; and
   a chip provided with an active face and a passive face which are opposite to each other, wherein the chip is embedded in the insulating dielectric material, the active face of the chip is in electrically-conductive connection with the inner signal line layer, and the passive face of the chip is in heat transfer connection with the heat dissipation metal face;
   wherein the thermally-conductive metal comprises a thermally-conductive metal face and a thermally-conductive metal column, a first side of the thermally-conductive metal face is connected with the passive face of the chip, and a second side of the thermally-conductive metal face is connected with the heat dissipation metal face through the thermally-conductive metal column.

2. The signal-heat separated TMV packaging structure according to claim 1, wherein the passive face of the chip is directly connected with the heat dissipation metal face, or a thermally-conductive metal is connected between the passive surface of the chip and the heat dissipation metal face.

3. The signal-heat separated TMV packaging structure according to claim 1, wherein the inner signal line layer is provided with multiple layers, and adjacent inner signal line layers are connected by a second conductive metal column.

4. The signal-heat separated TMV packaging structure according to claim 1, wherein the TMV structure is a first conductive metal column, and the first conductive metal column is directly connected with the inner signal line layer, or a tin solder is connected between the first conductive metal column and the inner signal line layer.

5. The signal-heat separated TMV packaging structure according to claim 1, wherein the insulating dielectric material comprises a plurality of insulating layers laminated in sequence, and one of the insulating layers located on the first side of the insulating dielectric material serves as the isolating layer.

6. The signal-heat separated TMV packaging structure according to claim 5, wherein the insulating dielectric material further comprises a packaging layer, the plurality of insulating layers define a packaging cavity for accommodating the chip, and the packaging layer covers an adjacent insulating layer, fills the packaging cavity, and wraps around the chip.

* * * * *